(12) United States Patent
Ferianz (10) Patent No.: US 9,172,363 B2
(45) Date of Patent: Oct. 27, 2015

(54) DRIVING AN MOS TRANSISTOR WITH CONSTANT PRECHARGING

(71) Applicant: Infineon Technologies Austria AG, Villach (AT)

(72) Inventor: Thomas Ferianz, Bodensdorf (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/063,920

(22) Filed: Oct. 25, 2013

(65) Prior Publication Data

US 2015/0116006 A1   Apr. 30, 2015

(51) Int. Cl.
*H03L 5/00* (2006.01)
*H03K 17/04* (2006.01)

(52) U.S. Cl.
CPC ........................ *H03K 17/04* (2013.01)

(58) Field of Classification Search
None
See application file for complete search history.

(56) References Cited

U.S. PATENT DOCUMENTS

| | | | |
|---|---|---|---|
| 5,744,878 A * | 4/1998 | Wachter et al. | 307/130 |
| 6,624,669 B1 * | 9/2003 | Tsuchi | 327/108 |
| 7,221,194 B2 * | 5/2007 | Lin et al. | 327/108 |
| 7,936,189 B2 * | 5/2011 | Tumminaro et al. | 327/108 |
| 2003/0011408 A1 * | 1/2003 | Tsuchi | 327/108 |
| 2004/0160258 A1 * | 8/2004 | Tobita | 327/333 |
| 2005/0062508 A1 * | 3/2005 | Nishimura | 327/112 |
| 2006/0006922 A1 * | 1/2006 | Sander | 327/434 |
| 2006/0290388 A1 * | 12/2006 | Tolle et al. | 327/108 |
| 2009/0134920 A1 * | 5/2009 | Kimura | 327/108 |
| 2013/0063186 A1 * | 3/2013 | DeBeer et al. | 327/109 |
| 2013/0106467 A1 * | 5/2013 | Mansri et al. | 327/108 |
| 2013/0181750 A1 * | 7/2013 | Lobsiger et al. | 327/109 |
| 2014/0062541 A1 * | 3/2014 | Wasekura | 327/109 |
| 2014/0203846 A1 * | 7/2014 | Janschitz et al. | 327/109 |
| 2014/0240007 A1 * | 8/2014 | Gibson | 327/109 |
| 2014/0307495 A1 * | 10/2014 | Fukuta et al. | 363/98 |

FOREIGN PATENT DOCUMENTS

| | | |
|---|---|---|
| DE | 19855604 C1 | 6/2000 |
| DE | 10038149 A1 | 2/2002 |
| DE | 10217611 A1 | 11/2003 |
| DE | 10240167 A1 | 3/2004 |

* cited by examiner

*Primary Examiner* — Lincoln Donovan
*Assistant Examiner* — Khareem E Almo
(74) *Attorney, Agent, or Firm* — Shumaker & Sieffert, P.A.

(57) ABSTRACT

A drive circuit may be configured to switch on an MOS transistor by precharging an input capacitance of the MOS transistor with a substantially constant amount of charge in a precharging phase, and charging the input capacitance with a controlled charging current after the precharging phase.

11 Claims, 5 Drawing Sheets

DRIVING AN MOS TRANSISTOR WITH CONSTANT PRECHARGING

TECHNICAL FIELD

Embodiments of the present invention relate to a method and driver circuit for driving an MOS transistor.

BACKGROUND

An MOS transistor, such as a MOSFET (Metal Oxide Semiconductor Field-Effect Transistor) or an IGBT (Insulated Gate Bipolar Transistor), is a voltage controlled device that includes an input capacitance. The MOS transistor can be switched on and off by controlling the voltage across the input capacitance. This input capacitance is formed by a gate electrode, a gate dielectric, and doped semiconductor regions that adjoins the gate dielectric, and includes a gate-source capacitance (in case of a MOSFET), or gate-emitter capacitance (in case of an IGBT). A normally-off MOS transistor switches on when a drive voltage across the gate-source capacitance reaches a threshold voltage, and switches off when the drive voltage falls below the threshold voltage.

In many applications it is desirable to switch on the MOS transistor as fast as possible, but to prevent steep switching edges. "Switching edges" are edges of a load current through the MOS transistor, and of a voltage across a load path (the drain-source path in a MOSFET, and the collector-emitter path in an IGBT) of the MOS transistor in the switching process.

According to a known concept of switching on an MOS transistor, the input capacitance is charged with a relatively high charging current in a precharging phase until the voltage across the input capacitance reaches the threshold voltage, and is charged with a lower current afterwards. In the precharging phase, the MOS transistor is in an off-state, so that a high precharging current helps to obtain a high switching speed but does not result in steep switching edges. The lower charging current after the precharging phase helps to prevent steep switching edges and further charges the input capacitance until the voltage across the input capacitance reaches a voltage level where the MOS transistor has a minimum on-resistance.

However, this concept requires to detect when the voltage across the input capacitance reaches the threshold voltage. This may include detecting at least one of the drive voltage across the input capacitance, detecting the load current (that starts to increase as the drive voltage reaches the threshold voltage), and the load-path voltage (that starts to decrease as the drive voltage reaches the threshold voltage). However, parasitic effects, such as voltages across line inductances, may make it difficult to precisely measure these parameters. Further, propagation delays may cause the input capacitance to be charged with the high precharging current between the time of detecting the threshold voltage and the time when the charging current is reduced to the lower charging current.

There is therefore a need for an improved method for switching an MOS transistor.

SUMMARY

A first embodiment relates to a method for switching on an MOS transistor by precharging an input capacitance of the MOS transistor with a substantially constant amount of charge in a precharging phase, and charging the input capacitance with a controlled charging current after the precharging phase.

A second embodiment relates to a drive circuit configured to switch on an MOS transistor by precharging an input capacitance of the MOS transistor with a substantially constant amount of charge in a precharging phase, and charging the input capacitance with a controlled charging current after the precharging phase.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
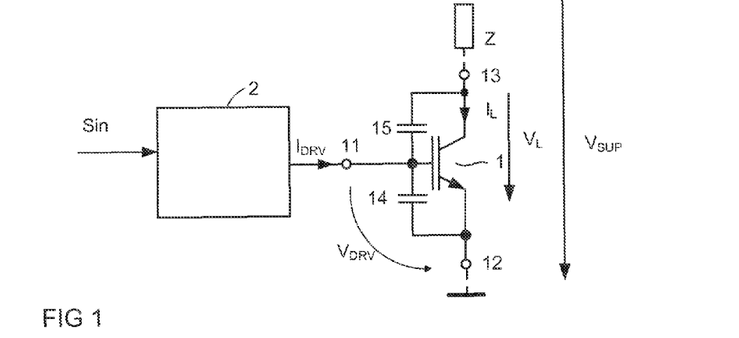
FIG. 1 shows one embodiment of a circuit arrangement including an MOS transistor implemented as an IGBT.

FIG. 1 illustrates one embodiment of an electronic circuit that includes an MOS transistor 1 and a drive circuit 2 configured to drive the MOS transistor 1. The MOS transistor 1 includes a control (drive) node (terminal) 11, and a load path between a first load node (load terminal) 12 and a second load node (load terminal) 13. The MOS transistor 1 is a voltage controlled electronic device that switches on and off dependent on a drive voltage $V_{DRV}$ between the control node 11 and the first load node 12. The MOS transistor 1 shown in FIG. 1 is implemented as an IGBT. In this case, the control node 11 is a gate node, the first load node 12 is an emitter node (emitter terminal), and the second load node 13 is a collector node (collector terminal).

The MOS transistor further includes an internal input capacitance. This input capacitance is formed by an internal gate electrode, a gate dielectric, and doped semiconductor regions adjoining the gate dielectric, and, in case of an IGBT includes a gate-emitter capacitance between the gate node 11 and the emitter node, and a gate-collector capacitance between the gate node 11 and the collector node. The gate-emitter capacitance is represented by a first capacitor 14 in the embodiment shown in FIG. 1, and the gate-collector capacitance is represented by a second capacitor 15 in the embodiment shown in FIG. 1.

Figure 2:
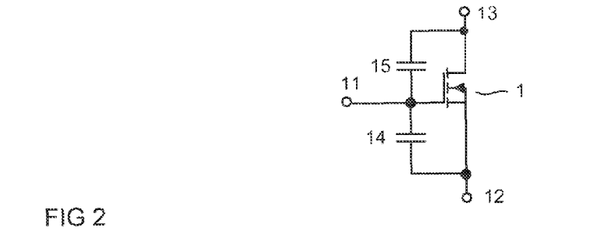
FIG. 2 shows an MOS transistor implemented as a MOSFET.

Implementing the MOS transistor 1 as an IGBT is only an example. Another type of MOS transistor, such as a MOSFET, may be used in the electronic circuit instead of an IGBT as well. FIG. 2 shows an MOS transistor 1 implemented as a MOSFET. In this case, the control node 11 is a gate node, the first load node 12 is a source node, and the second load node 13 is a drain node. The input capacitance includes a gate-source capacitance 14, and a gate-drain capacitance in this case.

Referring to FIG. 1, the MOS transistor 1 can be used as an electronic switch for switching a load current $I_L$ that flows through a load Z. For this, the load path (collector-emitter path, or drain-emitter path) of the MOS transistor 1 is connected in series with the load Z, wherein the series circuit with the MOS transistor and the load Z is coupled between first and second supply nodes between which a supply voltage $V_{SUP}$ is available. The MOS transistor 1 can be connected as a low-side switch (as shown), or as a high-side switch (not shown). In the first case, the MOS transistor 1 is coupled between the load Z and the second supply node where a negative supply potential (reference potential) is available, and in the second case the MOS transistor 1 is coupled between the load Z and the first supply node where a positive supply potential (reference potential) is available.

The load Z can be any type of electrical device, electronic device, or electronic circuit. According to one embodiment, the load Z includes a further MOS transistor (not shown) that has its load path connected in series with the MOS transistor 1, so that the two MOS transistors form a half-bridge circuit. An output of this half-bridge circuit is a circuit node between the load paths of the two MOS transistors.

MOS transistors, such as the MOS transistors 1 shown in FIGS. 1 and 2, are available with a variety of different voltage blocking capabilities, such as between several 10V up to 1700V.

The circuit symbols shown in FIGS. 1 and 2 represent n-type MOS transistors, in particular n-type enhancement (normally off) MOS transistors. MOS transistors of this type switch on when the drive voltage $V_{DRV}$ is positive and is higher than a threshold voltage level $V_{TH}$, and switch off when the drive voltage $V_{DRV}$ is below the threshold voltage level $V_{TH}$. However, the explanation provided below applies to p-type MOS transistors accordingly. P-type MOS transistors switch on when the drive voltage $V_{DRV}$ is negative and has a magnitude higher than a (negative) threshold voltage level, and switch off when the drive voltage $V_{DRV}$ has a magnitude below the magnitude of the threshold voltage, or is positive.

Just for the purpose of explanation it is assumed that the MOS transistor 1 is an n-type enhancement MOS transistor. This type of MOS transistor is in an off-state when the drive voltage $V_{DRV}$ is below the threshold voltage level $V_{TH}$. The MOS transistor 1 can be switched on by charging the input capacitance 14, 15 such that the drive voltage $V_{DRV}$ is above the threshold voltage level $V_{TH}$. The MOS transistor 1 starts to conduct when the drive voltage $V_{DRV}$ equals the threshold voltage level $V_{TH}$. However, an on resistance, which is an electrical resistance of the load path of the MOS transistor 1, is relatively high when the drive voltage $V_{DRV}$ equals the threshold voltage $V_{DRV}$. The MOS transistor 1 reaches a minimum on-resistance and minimum conduction losses, respectively, when the drive voltage $V_{DRV}$ is significantly above the threshold voltage $V_{TH}$. For example, an MOS transistor may have a threshold voltage level $V_{TH}$ of about 1.2 V, while it has a minimum on resistance, and minimum conduction losses, respectively, when the drive voltage $V_{DRV}$ is above 5 V or even above 10 V.

When the MOS transistor 1 shown in FIG. 1 is used as an electronic switch, a load current $I_L$ increases from zero to a current level defined by the load Z when the MOS transistor 1 switches from the off-state to the on-state. Equivalently, the load current $I_L$ decreases to zero when the MOS transistor switches from the on-state to the off-state. Slopes of the load current $I_L$ when the MOS transistor 1 changes the switching state are dependent on a switching speed of the MOS transistor 1. The switching speed of the MOS transistor 1 is dependent on how fast the input capacitance 14, 15 is charged between the time when the drive voltage $V_{DRV}$ reaches the threshold voltage level $V_{TH}$ and a time when the input capacitance 14 has been charged such that the MOS transistor 1 is operated in an operation mode that is referred to as linear mode (resistance mode) in case of a MOSFET, and saturation mode in case of an IGBT. The conduction losses decrease further as the drive voltage $V_{DRV}$ increases further, and reach their minimum as the drive voltage $V_{DRV}$ reaches a maximum. Thus, switching edges of the load current $I_L$ can be adjusted by the current level of a drive current $I_{DRV}$ that flows into the input capacitance 14, 15 after the drive voltage $V_{DRV}$ has reached the threshold voltage level $V_{TH}$. When the drive voltage $V_{DRV}$ is below the threshold voltage level $V_{TH}$ a current level of the drive current $I_{DRV}$ does not affect switching edges of the load current $I_L$.

Figure 3:
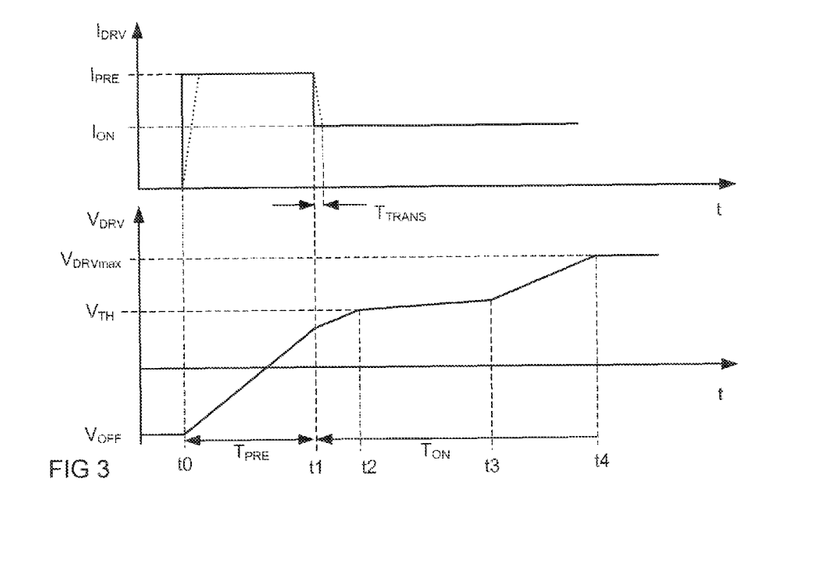
FIG. 3 shows timing diagrams that illustrate one embodiment of a method for driving an MOS transistor.

FIG. 3 shows timing diagrams illustrating one embodiment of a method for driving the MOS transistor 1 from the off-state to the on-state. FIG. 3 shows timing diagrams of the drive current $I_{DRV}$, and of the drive voltage $V_{DRV}$. Referring to the above, the drive voltage is the voltage between the control node 11 and the first load node 12, that is the voltage across the gate-emitter capacitance and the gate-source capacitance, respectively.

In the timing diagrams shown in FIG. 3, t0 denotes a time at which the switching operation starts, and t4 denotes a time at which the switching operation has been completed and the drive voltage $V_{DRV}$ has reached a maximum voltage level $V_{DRVmax}$. Referring to FIG. 3, driving the MOS transistor from the off-state to the on-state includes a precharging phase (precharging mode) in which the input capacitance 14, 15 is charged with a substantially fixed amount of electrical charge $Q_{PRE}$. This charge $Q_{PRE}$ is defined by a duration $T_{PRE}$ of the precharging phase and a current profile of the drive current $I_{DRV}$ during this time period. That is, $$Q_{PRE} = \int_{t0}^{T0+T_{PRE}} I_{DRV}(t)dt, \quad (1)$$

where $T_{PRE}$ denotes the duration of the precharging phase, and $I_{DRV}(t)$ denotes the drive current in the precharging phase. This drive current $I_{DRV}(t)$ can be timely variable. According to one embodiment, the drive current $I_{DRV}(t)$ has a substantially constant current level (precharging level) $I_{PRE}$ during the precharging phase, so that $I_{DRV}=I_{PRE}$. In this case, $$Q_{PRE}=I_{PRE} \cdot T_{PRE} \quad (2).$$

When the precharging current, that is the drive current $I_{DRV}$ in the precharging phase, has a substantially constant current level, the current profile of the drive current in the precharging phase is substantially rectangular. However using a precharging current with a substantially rectangular current profile is only an example. Precharging currents with other current profiles may be used as well. For example, the precharging current may have a trapezoidal current profile, as shown in dotted lines in FIG. 2, a current profile corresponding to a half wave, of a sine signal, or a current profile corresponding to a half wave of a sine-square signal. However, in each of these cases, the input capacitance 14, 15 is charged with a substantially constant (fixed) amount of electrical charge in the precharging phase.

The amount of electrical charge supplied to the input capacitance 14, 15 in the precharging phase may be selected such that at the end of the precharging phase the MOS transistor is still in the off-state. Thus, in the precharging phase, the drive current $I_{DRV}$ only charges the gate-emitter capacitance (gate-source capacitance) 14 (while the gate-collector capacitance (gate-drain capacitance) 15 is kept in a charged state) in order to increase the voltage level of the drive voltage $V_{DRV}$. The amount of charge supplied to the input capacitance, in particular the gate-emitter capacitance (gate-source capacitance), is adapted to a capacitance $C_{14}$ of the gate-emitter capacitance (gate-source capacitance), a voltage level $V_{OFF}$ of the drive voltage $V_{DRV}$ in the off-state, and the threshold voltage level $V_{TH}$ such that the drive voltage $V_{DRV}$ is below the threshold voltage level at the end of the precharging phase. That is:

$$Q_{PRE} < C_{14} \cdot (V_{TH} - V_{OFF}) \qquad (3).$$

However, it may be desirable to charge the input capacitance 14 during the precharging phase such that the drive voltage $V_{DRV}$ is close to the threshold voltage level $V_{TH}$. The input capacitance of transistors produced through the same manufacturing process may vary due to variations in the manufacturing process and dependent on the ambient temperature when the device is in operation. However, an overall variation of these input capacitances is relatively low, such as +/−10% relative to an average value. If, for example, $C_{14min}$ is the minimum gate-emitter capacitance (gate-source capacitance) of the transistors, then the precharge $Q_{PRE}$ is, for example, selected such that $$Q_{PRE} = a \cdot C_{14min} \cdot (V_{TH} - V_{OFF}) \qquad (4),$$

where a is, for example, between 0.9 and 0.99.

In this method, the precharging phase may have a fixed time duration $T_{PRE}$, so that none of the operation parameters of the MOS transistor 1, such as the drive voltage $V_{DRV}$, the load current $I_L$, or the load-path voltage $V_L$, needs to be detected in order to define the end of the precharging phase. The duration of the precharging phase is, for example, between 50 nanoseconds (ns) and 200 nanoseconds, in particular between 100 nanoseconds (ns) and 150 nanoseconds.

After the precharging phase, that is beginning at the time t1 in the embodiment shown in FIG. 3, the input capacitance 14 is charged further with a controlled drive current $I_{DRV}$. In this phase, that will be referred to as switch-on phase in the following, the input capacitance 14 is charged such that the drive voltage $V_{DRV}$ reaches the threshold voltage level $V_{TH}$ and increases to above the threshold voltage level $V_{TH}$. The current level of the drive current $I_{DRV}$ in this switch-on phase influences switching edges of the load current $I_L$ and the load-path voltage $V_L$, respectively. Referring to FIG. 3, the drive voltage $V_{DRV}$ increases during the charging phase, that is during the precharging period $T_{PRE}$. A slope of this increase of the drive voltage $V_{DRV}$ is dependent on the current profile during the precharging phase. When the drive current $I_{DRV}$ is substantially constant during the precharging phase (as illustrated in FIG. 3), the drive voltage $V_{DRV}$ at least at the beginning of the precharging phase increases substantially linearly.

After the precharging phase, the controlled drive current $I_{DRV}$ causes the input capacitance, in particular the gate-emitter capacitance (gate-source capacitance), to be charged further so that the drive voltage $V_{DRV}$ increases further until the drive voltage $V_{DRV}$ reaches the threshold voltage $V_{TH}$. At this time, the MOS transistor 3 starts to conduct so that the Miller Effect sets in. That is, beginning at this time, not only the gate-emitter capacitance (gate-source capacitance) is charged by the drive current $I_{DRV}$, but the gate-collector capacitance (gate-drain capacitance) 15, that is often referred to as Miller capacitance, is discharged via the conducting load path of the MOS transistor 1. The current required to discharge the Miller capacitance is provided by the drive current $I_{DRV}$. This reduces the slope of the rising edge of the drive voltage $V_{DRV}$. That is, at a given current level of the drive current $I_{DRV}$, an increase of the drive voltage $V_{DRV}$ is lower as compared to the time period before the time t2. The section of the timing diagram where the drive voltage $V_{DRV}$ increases slower is often referred to as Miller plateau. The Miller plateau ends at a time t3 when the MOS transistor enters the linear operation mode (MOSFET)/saturation mode (IGBT). The input capacitance may be further charged after this time until the drive voltage $V_{DRV}$ reaches the maximum voltage level $V_{DRVmax}$. This maximum voltage level $V_{DRVmax}$ is defined by the drive circuit 2. The drive current $I_{DRV}$ decreases to zero as the drive voltage $V_{DRV}$ reaches the maximum voltage level $V_{DRVmax}$.

According to one embodiment, in the switch-on phase, the drive current is controlled to have a substantially constant current level $I_{ON}$, at least until the time t3 at the end of the Miller plateau. However, it is also possible to control the drive current $I_{DRV}$ to have a variable current level in this time period. A maximum current level of the drive current in the switch-on phase is below an average drive current $I_{DRV-AVG}$ in the precharging phase, which is $$I_{DRV-AVG} = Q_{PRE}/T_{PRE} \qquad (5).$$

According to one embodiment, a maximum current level in the switch-on phase is below 60%, below 50%, or even below 40% of the average current level in the precharging phase.

In the embodiment shown in FIG. 2, at the end of the precharging phase the drive current decreases to controlled current level $I_{ON}$ that is applied to the input capacitance in the switch-on phase. However, it would also be possible for the drive current $I_{DRV}$ to first decrease below this current level $I_{ON}$ and then to increase to this current level $I_{ON}$ at the end of the precharging phase.

According to one embodiment, there is a transition period $T_{TRANS}$ between the end of the precharge period $T_{PRE}$ and the time when the drive current $I_{DRV}$ has assumed the desired on-level. In this transition period, the drive current level changes from the level at the end of the precharge phase to the desired switch-on level $I_{ON}$. According to one embodiment, this transition period $T_{TRANS}$ is shorter than 100 ns, or even shorter than 50 ns.

Figure 4:
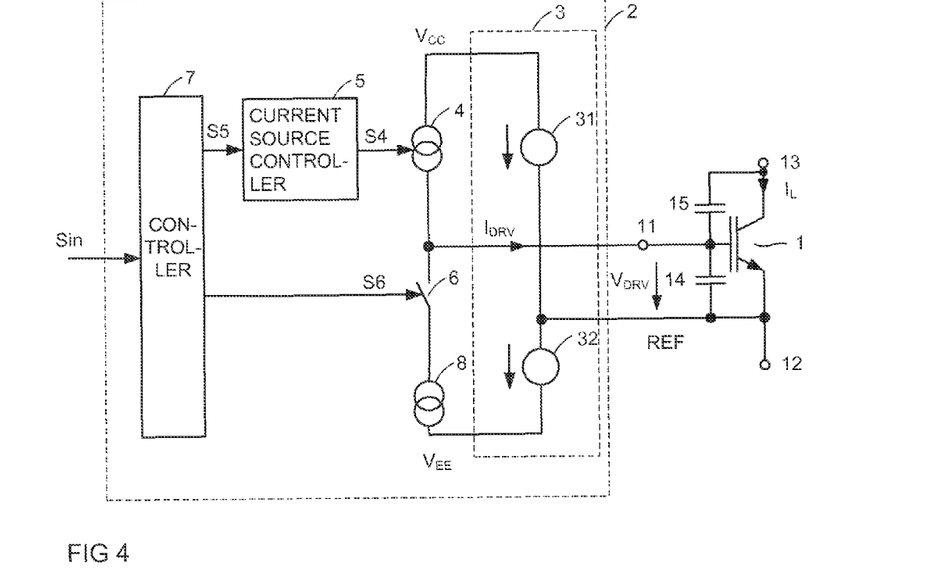
FIG. 4 illustrates one embodiment of a drive circuit that includes a controlled current source, and a current source controller.

FIG. 4 shows one embodiment of a drive circuit 2 that is configured to drive the MOS transistor 1 in accordance with the method explained with reference to FIG. 3. Referring to FIG. 4, the drive circuit 2 includes a supply circuit 3 with at least one supply voltage source 31. The first supply voltage source 31 is coupled to the first load terminal 12 and is configured to provide a first supply potential $V_{CC}$. This first supply potential $V_{CC}$ is positive relative to the electrical potential at the first load terminal 12. The electrical potential at the first load terminal 12 will be referred to as reference potential REF in the following. Optionally, the supply circuit 3 includes a second voltage source 32 that is coupled to the first load terminal 12, and is configured to provide a second supply potential $V_{EE}$. This second supply potential $V_{EE}$ is negative relative to the reference potential at the first load terminal 12. In case the second supply voltage source 32 is omitted, the second supply potential $V_{EE}$ corresponds to the reference potential REF at the first load terminal 12.

The drive circuit 2 further includes a controlled current source 4 that is coupled to the drive node 11 of the MOS transistor 1, and is configured to provide the drive current $I_{DRV}$ for switching on the MOS transistor 1. In the present embodiment, the controlled current source 4 is coupled between a first supply node, which is the circuit node where the first supply potential $V_{CC}$ is available, and the drive node 11 of the MOS transistor 1. The control current source 4 receives a control signal S4 from a current source controller 5, wherein the control signal S4 defines the current profile (that is the current level dependent on the time) of the drive current $I_{DRV}$, provided by the controlled current source 4. The current source controller 5 is configured to generate the control signal S4 such that the drive current $I_{DRV}$ has a current profile as explained with the reference to FIG. 3 when it is desired to switch on the MOS transistor 1.

Referring to FIG. 4, a controller 7 receives an input signal Sin and drives the current source controller 5. The input signal Sin indicates a desired switching state of the MOS transistor 1. That is, the input signal Sin includes an information on the desired switching state (on or off) of the MOS transistor 1. According to one embodiment, the input signal $S_{IN}$ assumes one of two signal levels, namely an on-level that indicates that it is desired to switch on the MOS transistor 1, and an off-level that indicates that it is desired to switch off the MOS transistor 1. The input signal may be provided by an external control circuit (not shown), such as a microcontroller.

Referring to the explanation above, the MOS transistor 1 switches off when the drive voltage $V_{DRV}$ falls below the threshold voltage level $V_{TH}$. The drive circuit 2 shown in FIG. 4 is configured to discharge the input capacitance 14, 15 when the input signal Sin has an off-level. In the present embodiment, the drive circuit 2 includes a switch 6 that is coupled between the control node 11 of the MOS transistor 1 and a second supply node, which is the supply node where the second supply potential $V_{EE}$ is available. Optionally, a current source 8 is connected in series with the switch 6. This current source 8 defines a discharging current that discharges the gate-emitter capacitance (gate-drain capacitance) 14 when the switch 6 has been switched on (is in an on-state). The controller 7 controls the switch 6 dependent on the input signal Sin. In particular, the controller 7 is configured to switch on electronic switch 6 when the input signal $S_{IN}$ indicates that it is desired to switch off the MOS transistor 1.

Figure 5:
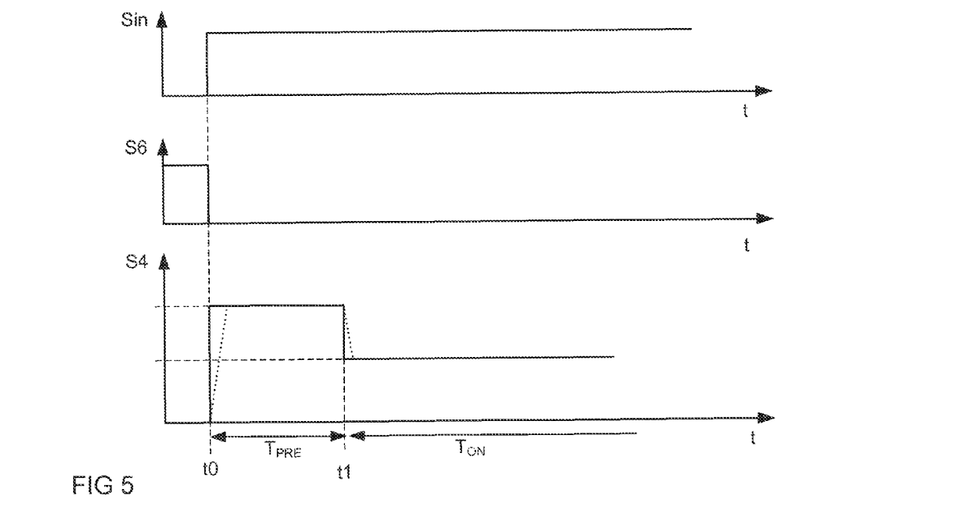
FIG. 5 shows timing diagrams that illustrate one way of operation of the drive circuit shown in FIG. 4.

FIG. 5 shows timing diagrams that illustrate one way of operation of the drive circuit 2 shown in FIG. 4. FIG. 5 shows timing diagrams of the input signal Sin, of the current source control signal S4, and of a drive signal S6 received by the electronic switch 6. Just for the purpose of explanation it is assumed that an on-level of the input signal Sin is a high-level, and that an off-level of the input signal Sin is a low level. Further, it is assumed that the switch drive signal S6 assumes one of two signal levels, namely an on-level that switches on the electronic switch 6, or an off-level that switches off the electronic switch 6. In the embodiment shown in FIG. 5, an on-level of the drive signal S6 is a high signal level, and an off-level of the drive signal S6 is a low signal level.

Referring to FIG. 5, the controller 7 switches on the electronic switch 6 as long as the input signal Sin has the off-level. However, this is only an example. It is also possible to discharge the gate-emitter capacitance (gate-source capacitance) 14 by closing the electronic switch 6 when the input signal Sin assumes the off-level, and to open the electronic switch 6 after the input capacitance 14 has been discharged. In this case, the control node 11 of the MOS transistor 1 is floating until the input signal Sin assumes an on-level that causes the control current source 4 to charge the gate-emitter capacitance (gate-source capacitance) 14. The gate-collector capacitance (gate-drain capacitance) is charged when the MOS transistor 1 is in the off-state.

After the input gate-emitter capacitance (gate-source capacitance) 14 has been discharged, the electrical potential at the control node 11 corresponds to the second supply potential $V_{EE}$. That is, the drive voltage $V_{DRV}$ is either 0 (when the optional second supply voltage source 32 is omitted), or is a negative voltage with a magnitude corresponding to the supply voltage provided by the second supply voltage source 32.

When the input signal Sin switches to the on-level, which is at time t0 in the timing diagram shown in FIG. 5, the controller 7 causes the current source controller 5 to generate the current source control signal S4 such that the controlled current source 4 charges the input capacitance 14, 15 with a predefined electrical charge in a precharging phase, and charges the input capacitance 14, 15 with a controlled current after the precharging phase. In the embodiment shown in FIG. 5, the current source control signal S4 is a continuous signal that has a profile corresponding to the profile of the desired drive current $I_{DRV}$.

Figure 6:
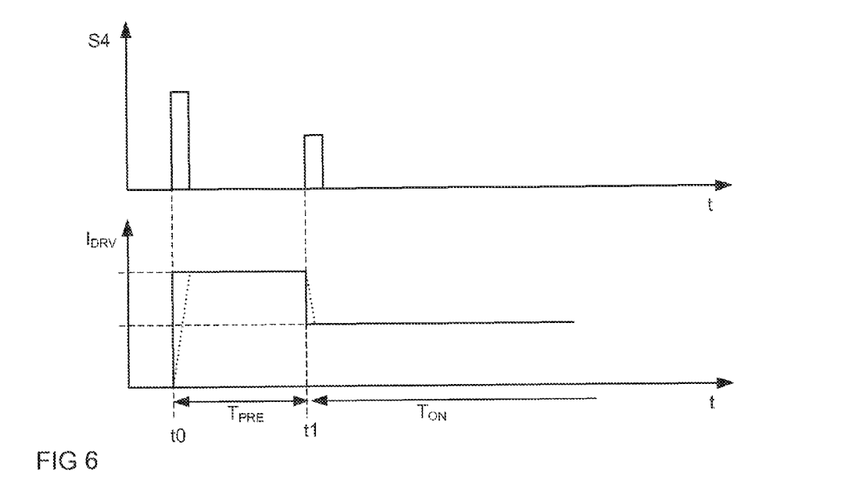
FIG. 6 shows timing diagrams that illustrate another way of operation of the drive circuit shown in FIG. 4.

However, this is only an example. In an embodiment in which the current level is substantially constant in the precharging phase, and is substantially constant in the switch-on phase, it is also possible that the current source control signal S4 is a discontinuous signal that only indicates desired changes of the signal level of the drive current $I_{DRV}$. This is schematically illustrated in FIG. 6. In this embodiment, a first signal pulse of the current source control signal S4 at the time t0 causes the current source 4 to generate the drive $I_{DRV}$ with the precharging level $I_{PRE}$, and a further signal pulse at the time t1 causes the current source 4 to generate the on-level $I_{ON}$ of the drive current $I_{DRV}$. The two signal pulses may have different amplitudes or different widths. Further, a digital source control signal S4 instead of the pulse signal shown in FIG. 6 may be used to control the controlled current source 4.

Figure 7:
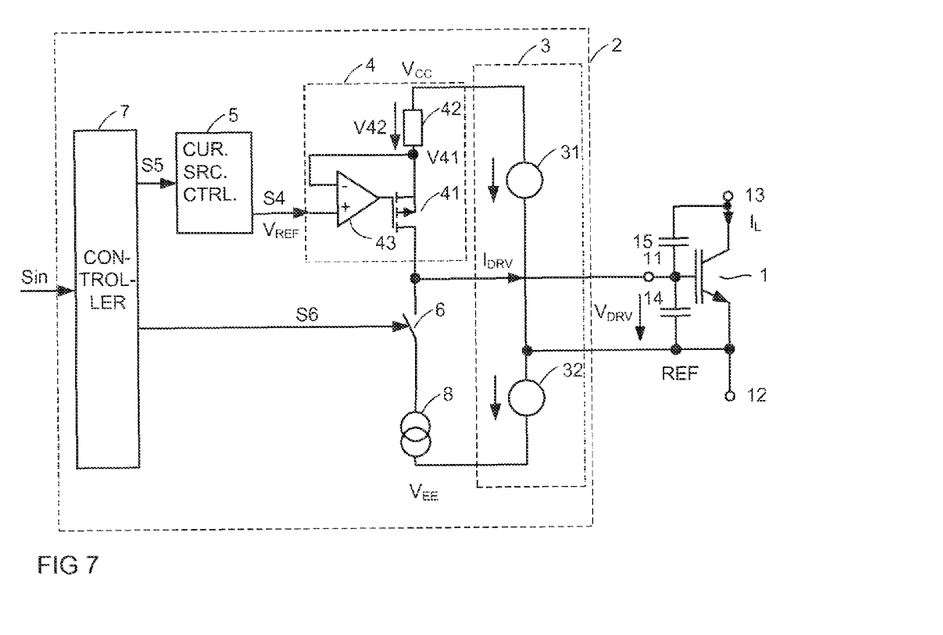
FIG. 7 shows one embodiment of a controlled current source configured to receive a reference signal.

FIG. 7 shows one embodiment of the controlled current source 4 in detail. In this embodiment, the controlled current source 4 includes a series circuit with a transistor 41 and a resistor 42 that is coupled between the control node 11 and the first supply node. The transistor 41 controls a voltage V42 across the resistor 42 and, therefore, controls the drive current $I_{DRV}$. In this case, the drive current is given as:

$$I_{DRV} = V42/R42 \qquad (6).$$

where R42 is a resistance of the resistor 42. The voltage V42 across the resistor 42 corresponds to the first supply potential $V_{CC}$ minus an electrical potential V41 at a circuit node between the resistor 42 and transistor 41. A differential amplifier, such as an operational amplifier 43 drives the transistor 41 such that the electrical potential V41 at this circuit node corresponds to a reference potential $V_{REF}$ represented by the current source control signal S4. In this case, the drive current $I_{DRV}$ is given as:

$$I_{DRV} = (V_{CC} - V_{REF})/R42 \qquad (7).$$

In this embodiment, the drive current $I_{DRV}$ increases as the reference voltage $V_{REF}$ decreases, and vice versa.

The controller 7 may include a potential barrier (not shown), such as a transformer, in particular a coreless transformer. That is, the input signal Sin received by the controller 7 can be referenced to an electrical potential that is different from an electrical potential to which the output signals of the controller 7, such as the drive signal S5 received by the current source controller 5, and the drive signal S6 received by the switch 6, are referenced to.

Figure 8:
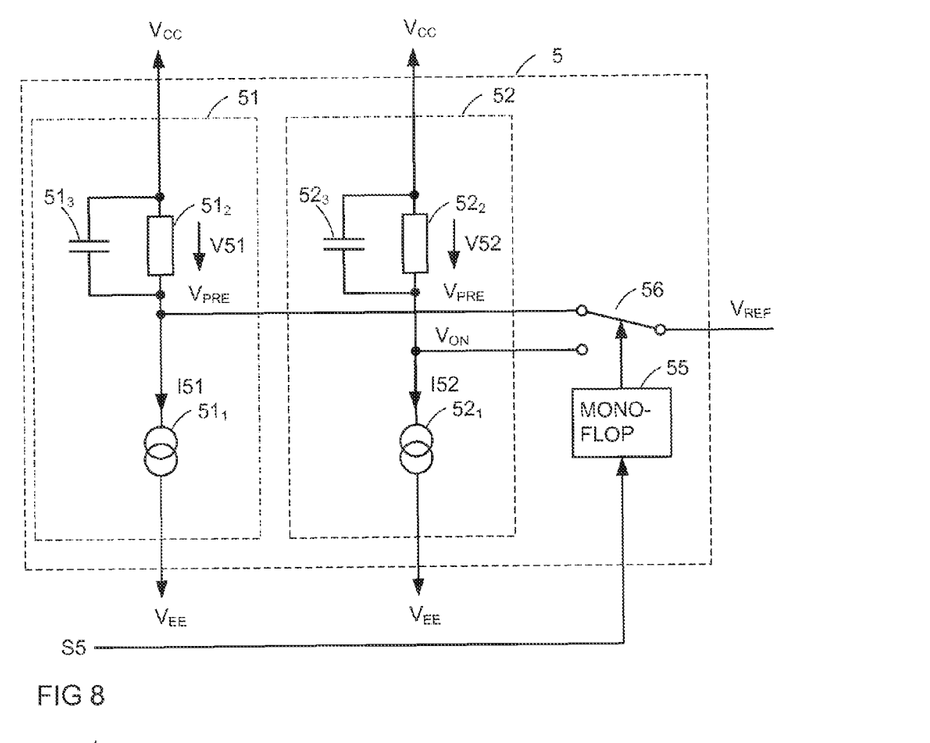
FIG. 8 shows one embodiment of a reference signal generator configured to generate the reference signal.

FIG. 8 shows one embodiment of the current source controller 5 that generates the reference voltage $V_{REF}$. In this embodiment, the current source controller 5 includes two voltage generation circuits, namely a first reference voltage generation circuit 51 that is configured to generate a first reference voltage $V_{PRE}$, and a second reference voltage generation circuit 52 that is configured to generate a second reference voltage $V_{ON}$. Each time the MOS transistor 1 is to be switched on, the current source controller 5 first provides the first reference voltage $V_{PRE}$ for the precharging period $T_{PRE}$ as the reference voltage $V_{REF}$, and then provides the second reference voltage $V_{ON}$ as the reference voltage $V_{REF}$.

For this, in the embodiment shown in FIG. 8, a crossover switch receives the first and the second reference voltages $V_{PRE}$, $V_{ON}$ and provides one of these first and second reference voltages $V_{PRE}$, $V_{ON}$ as the reference voltage $V_{REF}$ received by the controlled current source 4 at an output of the current source controller 5. In the embodiment shown in FIG. 8, the crossover switch 56 is controlled by a mono-flop 55 that is driven by the controller 7. According to one embodiment, the controller 7 triggers the mono-flop 55 each time the input signal Sin switches from the off-level to the on-level. After the mono-flop 55 has been triggered, the mono-flop 55 connects the first reference potential $V_{PRE}$ to the output of the current source controller 5 for a predefined time period (hold time) defined by the mono-flop. This time period corresponds to the precharging time $T_{PRE}$ explained before. After this time period, the switch 56 driven by the mono-flop connects the second reference voltage $V_{ON}$ to the output of the current source controller 5.

In the embodiment shown in FIG. 8, each reference signal generation circuit includes a series circuit with a current source $51_1$, $52_1$ and a resistor $51_2$, $52_2$ between the first and the second supply nodes. The first reference voltage $V_{PRE}$ and the second reference voltage $V_{ON}$, respectively, are available at circuit nodes between the current source $51_1$, $52_1$ and the capacitor $51_3$, $52_3$ in the respective series circuit. Instead of connecting the series circuits between the first and the second supply nodes, it is also possible to connect the series circuits between the first supply node and the second load terminal 12 where the reference potential REF is available. Optionally, a capacitor $51_3$, $52_3$ is connected in parallel with each of the resistors $51_2$, $52_2$.

In the embodiment shown in FIG. 8, the first reference potential $V_{PRE}$ is defined by the first and second supply potentials $V_{CC}$, $V_{EE}$, and a voltage V51 across the resistor $51_2$, and the second reference voltage $V_{ON}$ is defined by the first and second supply potentials $V_{CC}$, $V_{EE}$ and a voltage V52 across the resistor $52_2$, specifically:

$$V_{PRE}=V_{CC}-V51 \tag{6A}$$

$$V_{ON}=V_{CC}-V52 \tag{6B}$$

The voltages V51, V52 are each dependent on a resistance R51, R52 of the respective resistor $51_2$, $52_2$, and a current level I51, I52 of a current provided by the respective current source. That is, $$V51=R51 \cdot I51 \tag{7A}$$

$$V52=R52 \cdot I52 \tag{7B}$$

Figure 9:
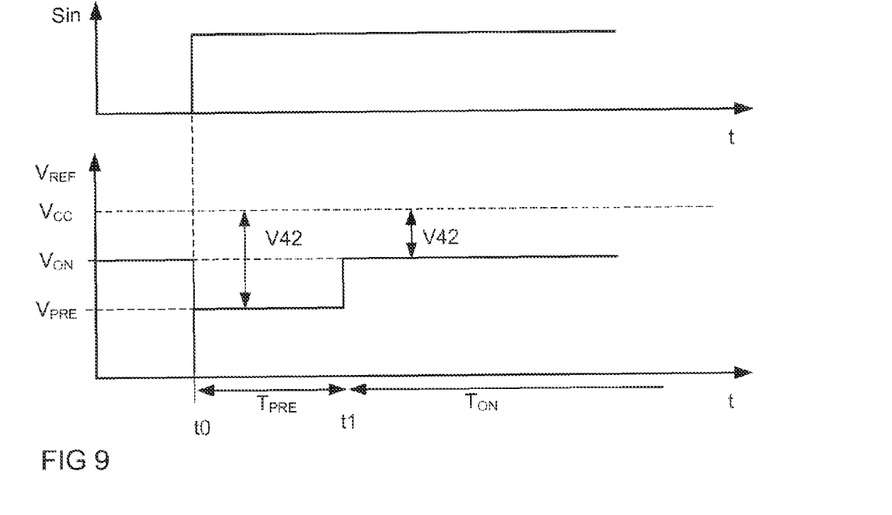
FIG. 9 shows timing diagrams that illustrate one way of operation of the reference signal generator shown in FIG. 8.

FIG. 9 shows timing diagrams that illustrate the operating principle of the drive shown in FIG. 7 when implemented with a current source controller 5 as shown in FIG. 8. Referring to FIG. 9, the reference potential $V_{REF}$ corresponds to the first reference potential $V_{PRE}$ during the precharging phase, that is during the time period $T_{PRE}$. After the precharging phase, the reference voltage $V_{REF}$ changes to the second reference voltage $V_{ON}$. The reference potential $V_{PRE}$ is more below the first supply potential $V_{CC}$ than the second reference potential $V_{ON}$, so that voltage V42 across the resisted 42 is higher during the precharging phase $T_{PRE}$ than after the precharging phase, so that the drive current $I_{DRV}$ has a higher current level during the precharging phase than after the precharging phase.

Figure 10:
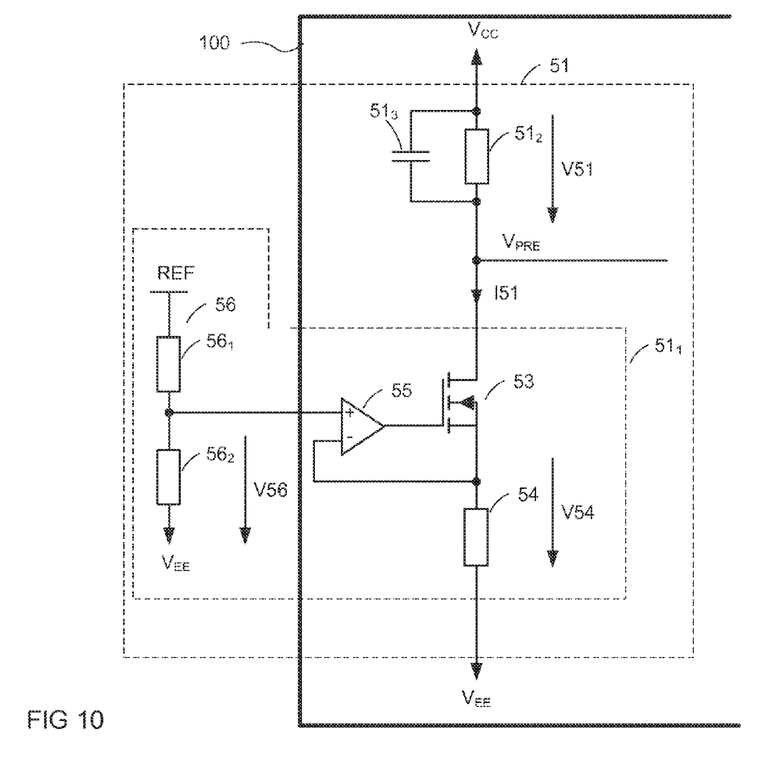
FIG. 10 illustrates one embodiment of a reference voltage source of the reference signal generator shown in FIG. 8.

FIG. 10 shows one embodiment of the first current source $51_1$ shown in FIG. 8. In this embodiment, the voltage source $51_1$ is an adjustable voltage source that generates its output voltage V51 dependent on an output voltage V56 provided by a voltage divider 56 that is connected between the reference node (first load terminal 12), and the second supply node $V_{EE}$. The voltage divider 56 includes first resistor $56_1$ and a second resistor $56_2$ connected in series between the reference node (the second load terminal 12) and the second supply node. The output voltage V56 of the voltage divider 56 is dependent on a ratio of resistances of the first and second resistor $56_1$, $56_2$. A differential amplifier 55, such as an operational amplifier, receives the output voltage V56 from the voltage divider and adjusts the current I51 provided by the current source $51_1$ dependent on this output voltage V56. For this, the differential amplifier 55 drives a transistor 53 that has its load-path connected in series with a resistor 54 between the output of the first reference signal generation circuit 51 and the second supply node $V_{EE}$ such that a voltage V54 across the resistor 54 substantially equals the output voltage V56 of the voltage divider. The current I51 is $$I51=V54/R54=V56/R54 \tag{8},$$

where R54 denotes the resistance of the resistor 54. Thus, considering equations (7A) and (8) the first reference potential $V_{PRE}$ is dependent on the output voltage V56 of the voltage divider as follows:

$$V_{PRE}=V_{CC}-V51=V_{CC}-R51 \cdot I51=V_{CC}-V56 \cdot R51/R54 \tag{9}.$$

Thus, the first reference voltage $V_{PRE}$ is dependent on the output voltage $V_{PRE}$ of the voltage divider, and on the ratio R51/R54 defined by the resistances of the resistors $51_2$, and 54.

According to one embodiment, the drive circuit 2 is integrated in an integrated circuit package except for the voltage divider 56. This integrated circuit package 100 is schematically illustrated in FIG. 10. In this case, the level of the first reference potential $V_{PRE}$ can be adjusted externally by suitably selecting the resistors $56_1$, $56_2$ of the voltage divider 56. In this way, the precharge $Q_{PRE}$, that is the electrical charge that is provided to the input capacitor 14 during the precharging phase, can be adjusted by suitably selecting the transistor $56_1$, $56_2$ of the voltage divider 56. Thus, the drive circuit 2 can be used for different types of MOS transistors that have different characteristics, in particular different input capacitances.

In the description hereinbefore, directional terminology, such as "top," "bottom," "front," "back," "leading," "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method, comprising:
switching on an MOS transistor by precharging an input capacitance of the MOS transistor with a substantially constant amount of charge in a precharging phase, and charging the input capacitance with a controlled charging current after the precharging phase;
generating, with a current source controller, a current source control signal, such that a controlled current source provides substantially constant amount of charge in the precharging phase and provides the controlled charging current after the precharging phase;
wherein generating the current source control signal includes generating the current source control signal with a first signal level for a predefined time period, and generating the current source control signal with a second signal level different from the first signal level after the predefined time period.

2. The method of claim 1, wherein the controlled charging current is substantially constant.

3. The method of claim 1, wherein the precharging phase has a substantially fixed duration.

4. The method of claim 3, wherein precharging the input capacitance in the precharging phase comprises:
controlling a precharging current to have a predefined current profile.

5. The method of claim 4, wherein the predefined current profile is selected from one of:
a rectangular current profile;
a trapezoidal current profile;
a current profile corresponding to a half wave of a sine signal; and
a current profile corresponding to a half wave of a sine-square signal.

6. The method of claim 1, wherein a maximum current level of the charging current is lower than a mean current level of a precharging current in the precharging phase.

7. The method of claim 6, wherein a maximum current level of the charging current is at most 60% of a mean level of a precharging current in the precharging phase.

8. The method of claim 1, wherein the MOS transistor is one of a MOSFET, and an IGBT.

9. A drive circuit configured to switch on an MOS transistor by precharging an input capacitance of the MOS transistor with a substantially constant amount of charge in a precharging phase, and charging the input capacitance with a controlled charging current after the precharging phase, the drive circuit comprising:
a controlled current source configured to provide a current in accordance with a current source control signal; and
a current source controller configured to generate the current source control signal such that the controlled current source, in the precharging phase, provides the substantially constant amount of charge, and, after the precharging phase, provides the controlled charging current,
wherein the current source controller is configured to generate the current source control signal with a first signal level for a predefined time period, and to generate the current source control signal with a second signal level different from the first signal level after the predefined time period.

10. The drive circuit of claim 9, wherein the current source controller comprises a voltage divider, and wherein the first signal level is dependent on an output signal of the voltage divider.

11. The drive circuit of claim 10, wherein the drive circuit comprises an integrated circuit package, and wherein the voltage divider is located outside the integrated circuit package.

* * * * *